United States Patent
Bae et al.

(10) Patent No.: US 10,862,246 B2
(45) Date of Patent: Dec. 8, 2020

(54) FOREIGN SUBSTANCE DETECTING CIRCUIT AND ELECTRONIC DEVICE INCLUDING THE SAME

(71) Applicant: Samsung Electronics Co., Ltd., Suwon-si (KR)

(72) Inventors: Jun-han Bae, Seoul (KR); Je-kook Kim, Yongin-si (KR); Hyoung-seok Oh, Seoul (KR); Sang-beom Kim, Seoul (KR); Se-jong Park, Anyang-si (KR); You-so Cheon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 64 days.

(21) Appl. No.: 16/194,704

(22) Filed: Nov. 19, 2018

(65) Prior Publication Data
US 2019/0181590 A1    Jun. 13, 2019

(30) Foreign Application Priority Data

Dec. 13, 2017  (KR) .................. 10-2017-0171585
May 30, 2018   (KR) .................. 10-2018-0062092

(51) Int. Cl.
*H01R 13/641*   (2006.01)
*C23F 13/04*    (2006.01)
(Continued)

(52) U.S. Cl.
CPC .......... *H01R 13/641* (2013.01); *C23F 13/04* (2013.01); *G01N 17/00* (2013.01);
(Continued)

(58) Field of Classification Search
None
See application file for complete search history.

(56) References Cited

U.S. PATENT DOCUMENTS

| | | | |
|---|---|---|---|
| 2009/0108848 A1* | 4/2009 | Lundquist | H01R 13/7039 324/538 |
| 2013/0300429 A1* | 11/2013 | Jefferies | B60L 53/16 324/511 |

(Continued)

FOREIGN PATENT DOCUMENTS

| KR | 10-2014-0080124 | 6/2014 |
|---|---|---|
| KR | 10-2017-0090655 | 8/2017 |

*Primary Examiner* — Jas A Sanghera
(74) *Attorney, Agent, or Firm* — Harness, Dickey and Pierce, P.L.C.

(57) ABSTRACT

Provided are a foreign substance detecting circuit, an electronic device including the foreign substance detecting circuit, and a method of detecting foreign substance. The electronic device includes a connector connected to an external cable and including a plurality of pins, a foreign substance detecting circuit configured to, when the cable is connected to the connector, detect a resistance from a first pin that is set to be in an open state or to be connected to a pull-down resistor from among the plurality of pins in a state where the cable is connected, and determine whether there is a foreign substance in the connector, and an application processor configured to control operations in the electronic device for performing a post-process when there is the foreign substance in the connector, according to a detection result from the foreign substance detecting circuit.

16 Claims, 10 Drawing Sheets

(51) Int. Cl.
- *G01N 17/00* (2006.01)
- *G01R 31/28* (2006.01)
- *H01R 13/703* (2006.01)
- *H01R 13/66* (2006.01)
- *H01R 107/00* (2006.01)
- *H01R 24/60* (2011.01)

(52) U.S. Cl.
CPC ..... *G01R 31/2813* (2013.01); *H01R 13/6683* (2013.01); *H01R 13/7031* (2013.01); *H01R 24/60* (2013.01); *H01R 2107/00* (2013.01); *H01R 2201/20* (2013.01)

(56) References Cited

U.S. PATENT DOCUMENTS

| | | | |
|---|---|---|---|
| 2015/0346127 A1* | 12/2015 | Kalinichev | G01N 27/048 361/86 |
| 2016/0349308 A1 | 12/2016 | Zhang et al. | |
| 2017/0017598 A1 | 1/2017 | Chou et al. | |
| 2017/0047749 A1 | 2/2017 | Cornelius | |
| 2017/0124010 A1 | 5/2017 | Whitby-Strevens et al. | |
| 2017/0155214 A1 | 6/2017 | Shen et al. | |
| 2017/0220090 A1 | 8/2017 | Kim | |
| 2017/0248641 A1 | 8/2017 | Shi et al. | |
| 2018/0062326 A1* | 3/2018 | Card | H01R 12/7088 |
| 2018/0373216 A1* | 12/2018 | Chang | G01R 31/40 |

\* cited by examiner

FOREIGN SUBSTANCE DETECTING CIRCUIT AND ELECTRONIC DEVICE INCLUDING THE SAME

CROSS-REFERENCE TO RELATED APPLICATIONS

This application claims the benefit of Korean Patent Application Nos. 10-2017-0171585, filed on Dec. 13, 2017 and 10-2018-0062092, filed on May 30, 2018, in the Korean Intellectual Property Office, the disclosures of each of which are incorporated herein in their entirety by reference.

BACKGROUND

Example embodiments of the inventive concepts relate to a foreign substance detecting circuit. For example, at least some example embodiments relate to a foreign substance detecting circuit and/or an electronic device including the same.

In order to reduce (or, alternatively, prevent) corrosion of a connector, it may be desirable to precisely determine whether foreign substances are introduced into the connector. When foreign substances are introduced, a plurality of pins in the connector may be shorted from one another, and when pins transferring high voltage are shorted from other pins, there is a possibility of breaking pins.

During an operation such as a charging operation, a power voltage may be provided to a connector of an electronic device via a cable from outside, and a boosting process of the power voltage provided through the connector may be performed in order to improve charging efficiency. Here, when a short-circuit occurs among the pins due to the introduction of the foreign substances, a risk of breaking the pins further increases.

SUMMARY

Example embodiments of inventive concepts provide a foreign substance detecting circuit capable of relatively easily determining whether there is a foreign substance in a connector in a state of being connected to a cable, and/or an electronic device including the foreign substance detecting circuit.

According to an example embodiment of the inventive concepts, there is provided an electronic device including: a connector configured to connect to an external cable, the connector including a plurality of pins; a foreign substance detecting circuit configured to, detect a resistance from a first pin from among the plurality of pins, in response to the external cable being connected to the connector, the first pin being one of the plurality of pins set to an open state or connected to a pull-down resistor, and determine whether there is a foreign substance present in the connector based on the resistance; and an application processor configured to perform a post-process in response to the foreign substance detecting circuit determining that the foreign substance is present in the connector.

According to another example embodiment of the inventive concepts, there is provided a configuration channel integrated circuit (CCIC) connected to a configuration channel 1 (CC1) pin and a configuration channel 2 (CC2) pin of a connector according to a universal serial bus (USB) type-C interface, the CCIC including a processor configured to control internal operations in the CCIC; and at least one controller configured to, control, in a normal mode, connection to the CC1 pin and the CC2 pin to perform a data connection and control operation, control, in a foreign substance detection mode, connection to a first pin in response to an external cable being connected to the connector, the first pin being one of the CC1 pin and the CC2 pin that is set to an open state, set the first pin to a floating state after discharging the first pin in the foreign substance detection mode, and determine whether there is a foreign substance in the connector based on a resistance detected from the first pin.

According to another example embodiment of the inventive concepts, there is provided a method of detecting a foreign substance in an electronic device, the method including: sensing an external cable being connected to a connector, the connector including a plurality of pins; performing a discharging operation of a first pin of the plurality of pins, wherein the first pin is set to an open state or connected to a pull-down resistor in a state where the external cable is connected to the connector; determining whether the foreign substance is present in the connector based on a resistance detected from the first pin after the discharging operation; and instructing, a display device, to display an indication that the foreign substance is present in the connector in response to determining that the foreign substance is present.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, one or more example embodiments of the inventive concepts will be described in detail with reference to accompanying drawings.

Figure 1:
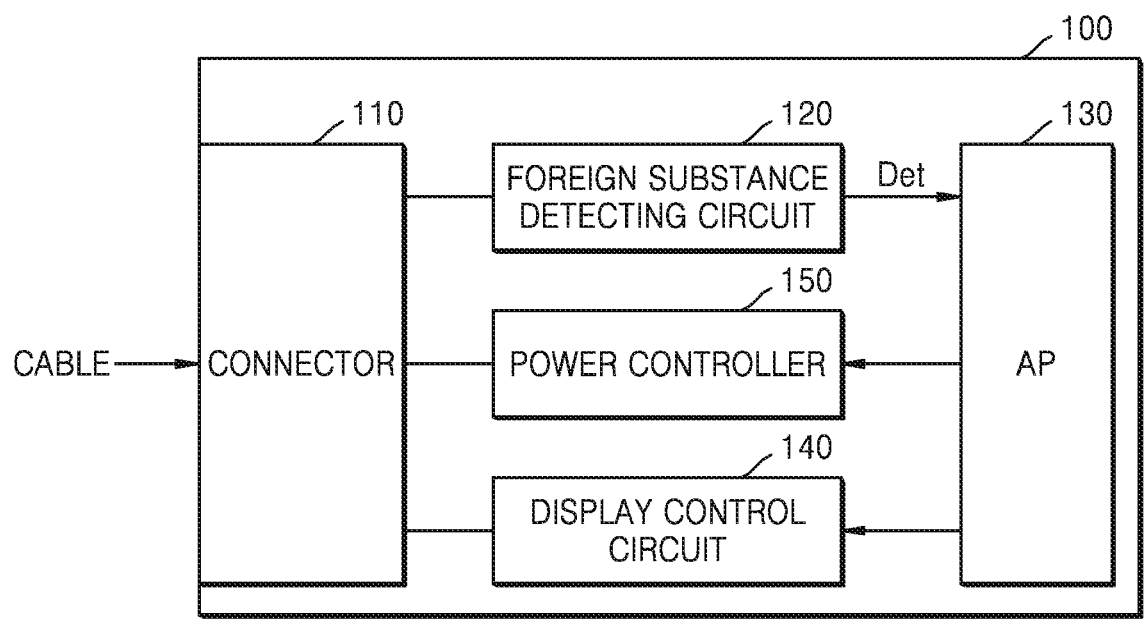
FIG. 1 is a block diagram of an electronic device according to an example embodiment of the inventive concepts.

FIG. 1 is a block diagram of an electronic device 100 according to an example embodiment of the inventive concepts.

Referring to FIG. 1, the electronic device 100 may include a connector 110 connected to an external cable to perform communication between an external device and the electronic device 100, and may further include a foreign substance detecting circuit 120 connected to at least one pin included in the connector 110. Also, the electronic device 100 may include a processor controlling overall operations therein, and as an example, the electronic device 100 may include an application processor (AP) 130. In addition, the electronic device 100 may further include a display control circuit 140 and a power controller 150.

While FIG. 1 illustrates the foreign substance detecting circuit 120, the AP 130, the display control circuit 140 and the power controller 150 as separate elements, example embodiments are not limited thereto. For example, according to an example embodiment, the foreign substance detecting circuit 120 may be implemented as an integrated circuit (IC), or may be provided in an IC performing various functions. For example, in some example embodiments, the foreign substance detecting circuit 120, the AP 130, the display control circuit 140 and the power controller 150 may be provided in one or more integrated circuits (ICs) and/or the AP 130 may execute instructions to perform the features of one or more of the same.

As an example, the connector 110 may include a plurality of pins defined according to a desired (or, alternatively, a predetermined) specification, and the foreign substance detecting circuit 120 may include a circuit capable of detecting a resistance or a voltage from one or more of the plurality of pins included in the connector 110. That is, when foreign substances are introduced into the connector 110 (or there are foreign substances in the connector 110), a value of the resistance detected from the pin may vary depending on the foreign substances, and the foreign substance detecting circuit 120 detects changed resistance to detect or determine whether there are foreign substances in the connector 110.

The connector 110 may have various structures. Various example embodiments of the inventive concepts provide a foreign substance detecting apparatus and method of reducing (or, alternatively, preventing) corrosion or breakage of the connector by precisely determining a status in which various foreign substances including moisture are introduced in connectors of various structures. Hereinafter, a universal serial bus (USB) type-C or a USB power delivery (PD) type-C connector structure will be provided as a structure of the connector 110 in the example embodiments. However, the example embodiments of the inventive concepts may be similarly or identically applied to other connectors of various structures. As an example, the example embodiments of the inventive concepts may be applied to a USB connector structure of another type.

According to an example embodiment, when a foreign substance such as moisture is introduced into the connector 110, the electronic device 100 may determine the foreign substance as a resistance (or impedance). When there is no foreign substance in the connector 110, a very large resistance or infinite resistance is shown from a pin in an open or floating state, but when the foreign substance is introduced, a small resistance value, not the infinite resistance, may be shown from the pin. Hereinafter, features of determining whether the foreign substance is introduced by utilizing one pin or one kind of pins from among pins of a USB type-C connector structure will be described. According to detailed example embodiments, an example in which a configuration channel (CC) pin is used from among the pins in the USB type-C connector structure will be described below. However, the inventive concepts are not limited thereto, and other various kinds of pins may be used.

In addition, in describing configurations and operations of an electronic device including a connector having the USB type-C structure according to the example embodiments, the connector may denote a structure executing an electric connection between two devices. According to example embodiments, the connector may denote a receptacle to which an external cable is coupled, and thus, terms 'connector' and 'receptacle' may be interchangeably used. In addition, in some example embodiments, the connector may be a concept further including a plug, and the cable may be referred to as a plug. In addition, the term 'pin' may be replaced with a 'terminal'.

According to an example embodiment, the electronic device 100 may determine whether resistances of the pins vary due to the introduction of foreign substances, by utilizing a region in the connector 110, which does not affect the USB type-C operations. When there is no foreign substance, infinite resistance is detected from a pin that is in a floating state, but when there is a foreign substance, a small value of resistance (e.g., a few k$\Omega$ (ohm) to a few MS (ohm)), not the infinite resistance, may be detected. There may be various methods of monitoring the resistance, and the electronic device 100 may selectively use the various methods of monitoring the resistance to detect variation in the resistance value.

The electronic device 100 according to various example embodiments of the disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), an MPEG-1 audio layer-3 (MP3) player, a mobile medical device, a camera, and a wearable device. According to various example embodiments, the wearable device may include, for example, at least one of an accessory type (e.g., a watch, a ring, a bracelet, an anklet, a necklace, glasses, contact lenses, or a Head-Mounted Device (HMD)), a fabric or clothing integrated type (e.g., electronic clothing), a body-mounted type (e.g., a skin pad, or tattoo), and a bio-implantable type (e.g., an implantable circuit), or the like.

Hereinafter, an operation of detecting the foreign substance according to an example embodiment will be described below.

In a state where the electronic device 100 is turned off, an external cable may be connected to the connector 110 of the electronic device 100. As an example, the external cable may be a charging cable, and a power voltage may be provided to the electronic device 100 via the external cable. The foreign substance detecting circuit 120 may perform operations for detecting foreign substances by using power from a battery provided in the electronic device 100 or the power voltage provided through the external cable.

In an example embodiment of the inventive concepts, the foreign substance detecting circuit 120 may be electrically connected to at least one pin (e.g., a first pin) of the connector 110, and may detect or determine whether there is the foreign substance by detecting a resistance from the first pin. For example, a voltage level measured from the first pin may vary depending on the resistance of the first pin, and the resistance may be detected based on the voltage level. According to an example embodiment, in a state where a cable is connected to the connector 110, some of a plurality of pins provided in the connector 110 may have open states, and one of the pins having the open states may correspond to the first pin.

As an example, in a case where the external cable is connected to the connector 110, a voltage of a desired (or, alternatively, a predetermined) level (e.g., a ground voltage level) may be detected from the first pin when the foreign substance is not introduced. On the other hand, at least another pin of the connector 110 may receive the power voltage from the external cable, and when the first pin and the pin receiving the power voltage (e.g., a second pin) are shorted from each other due to the foreign substance, the voltage level detected from the first pin may vary. As an example, the voltage level detected from the first pin may vary depending on a resistance value formed between the first pin and the second pin.

The foreign substance detecting circuit 120 compares the detected voltage level with a desired (or, alternatively, a predetermined) reference value, and determines whether the foreign substance is introduced according to a comparison result and generates a determination result Det.

According to an example embodiment, when it is determined that the foreign substance is introduced, the foreign substance detecting circuit 120 may perform an internal control operation for performing additional processes corresponding to the above case. Also, the AP 130 may control internal operations in the electronic device 100 based on the determination result Det.

For example, according to an example embodiment, the AP 130 may control the display control circuit 140 based on the determination result Det, so that a warning screen notifying a user of the introduction of the foreign substance may be output. Also, the power controller 150 may correspond to a power management IC that performs a function of controlling electric power provided to various elements in the electronic device 100. As an operation example, the power controller 150 may perform a boosting operation of the power voltage provided through the external cable, and may perform a control operation not to execute the boosting operation when the foreign substance is introduced, based on a control of the AP 130.

According to the example embodiment as above, the foreign substance detecting circuit 120 may perform the operation of detecting the foreign substance in a state where the external cable is connected to the connector 110. For example, when the external cable is connected to the electronic device 100 in a state where the electronic device 100 is in a turn-off state, the electronic device 100 may be switched to a turn-on state in order to perform a function such as a charging operation (or may enter a low-power mode for only activating some functions). In addition, in order to reduce the probability of breaking the pins due to the introduction of the foreign substance, a warning screen for suggesting the user to remove the external cable may be output or an internal power adjusting operation may be performed. As an example, the AP 130 may control the power controller 150 to inhibit (or, alternatively, prevent) an electric current from flowing to the connector 110, and to inhibit (or, alternatively, prevent) an operation using the connector 110, e.g., the charging operation.

According to an example embodiment, each of the plurality of pins included in the connector 110 may perform an exclusive function for communicating with an external device, and in the USB type-C structure, the connector 110 may include a configuration channel (CC) 1 pin and a CC2 pin (see FIG. 3) used to identify the external device. When the external cable is connected to the connector 110, one of the CC1 pin and the CC2 pin may have an open state or may be connected to a desired (or, alternatively, a predetermined) pull-down resistor (e.g., 1 k pull-down resistor in the USB type-C structure). In the above example embodiment, the first pin may correspond to one of the CC1 pin and the CC2 pin. Also, the electronic device 100 may include a configuration channel integrated circuit (CCIC) (see FIG. 3) that may identify an external device according to a voltage or a resistance detected from the CC1 and CC2 pins, and the foreign substance detecting circuit 120 may be included in the CCIC.

In addition, the electronic device 100 according to an example embodiment may be variously modified, other than the configuration of FIG. 1. As an example, the power controller 150 or a part of the power controller 150 may be implemented in the foreign substance detecting circuit 120. For example, when it is determined that the foreign substance is introduced into the connector 110 according to the result of detecting the resistance from the first pin, the foreign substance detecting circuit 120 may perform a control operation, e.g., reducing a level of the voltage or the current provided to the connector 110 or blocking supply of the voltage or current.

Figure 2:
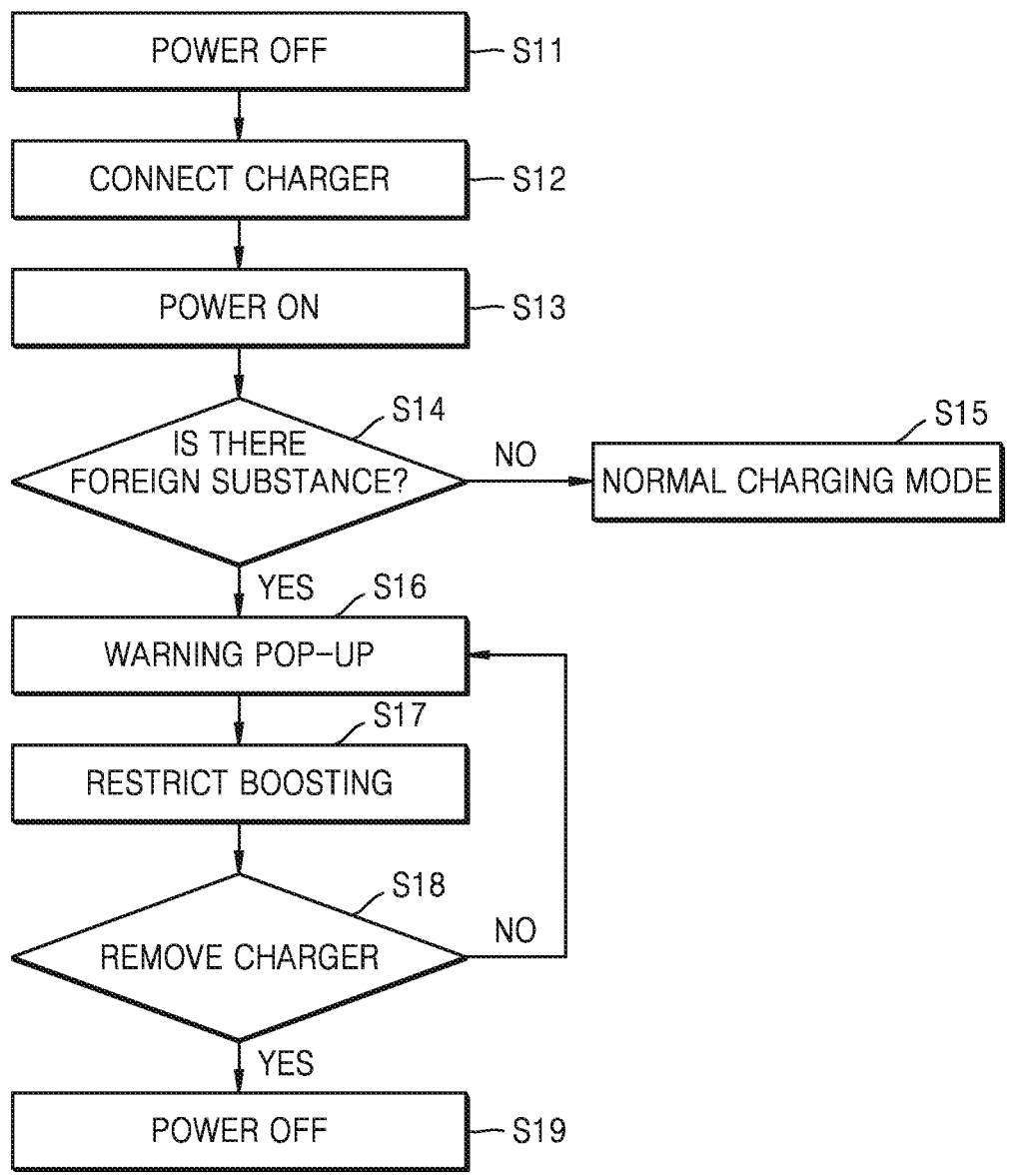
FIG. 2 is a flowchart illustrating a method of detecting a foreign substance, according to an example embodiment of the inventive concepts.

FIG. 2 is a flowchart illustrating a method of detecting a foreign substance, according to an example embodiment of the inventive concepts.

Referring to FIG. 2, in operation S11, a system (e.g., mobile device) including a USB type-C connector may be in a power-off state, and, in operation S12, the system may switch an operation mode to a power-on state when connection of an external cable (or plug) is sensed (S12).

In operation S13, in response to switching to the power-on state, the system may perform a charging function and a communication function. As an example, the system may normally operate some circuit configurations related to the charging and communication functions, from among internal elements, in the power-on state.

In operation S14, since the cable is already connected to the system, the system may detect whether there is a foreign substance is performed in a state where the cable is connected.

In operation S15, the system may operate in a normal charging mode when the foreign substance detecting circuit 120 determines that the foreign substance is not introduced as a result of detection.

On the other hand, in operation S16, a warning may be notified to a user as a pop-up based on a display control operation so as to guide the user to remove the cable when the system detects that the foreign substance is introduced.

In addition, generally an operation of boosting a level of a power voltage from outside (e.g., a VBUS voltage in the type-C connector structure) may be performed in the system for performing the charging operation.

However, in operation S17, boosting of the VBUS may be restricted or reduced through a power management operation in the system or a control operation may be performed to reduce the voltage and/or current of the VBUS through communication with an external device connected to the cable, when it is detected that the foreign substance is introduced. As an example, the AP in the system may control the power management IC to prevent the electric current from flowing to the connector or the charging operation from being performed.

In addition, in operation S18, the system may determine whether the user removes the cable, and, in operation S19, the system may be switched to the power-off state when the external cable is removed.

In addition, according to an example embodiment of the inventive concepts, the system may detect the foreign substance by using the CC pin as described above, and various operations for detecting the foreign substance may be controlled via the CCIC connected to the CC pin or may be controlled based on a control operation of the AP in the system.

Figure 3:
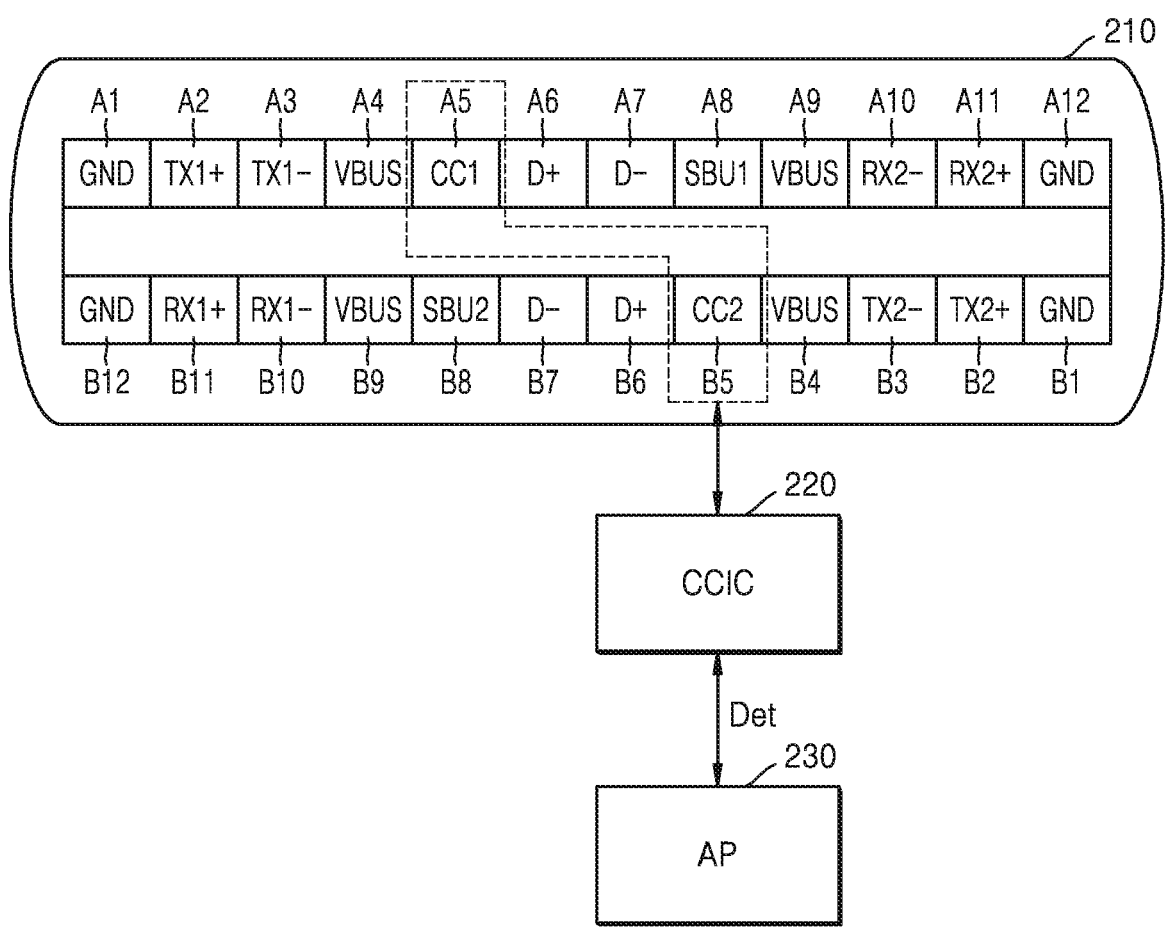
FIG. 3 is a diagram of a universal serial bus (USB) type-C receptacle structure as a connector applied to an example embodiment of the inventive concepts.

FIG. 3 is a diagram of a USB type-C receptacle structure as a connector applied to an example embodiment of the inventive concepts.

As shown in FIG. 3, the USB type-C receptacle structure may have 12×2 pins in a symmetric structure. Various terms shown in FIG. 3 may be easily appreciated by one of ordinary skill in the art through a USB specification, and thus, detailed descriptions thereof are omitted.

Referring to FIG. 3, an electronic device 200 may include a connector 210, a CCIC 220, and an AP 230, and the connector 210 may include twenty-four (24) pins satisfying the specification of the USB type-C receptacle structure. That is, a cable may be connected to the connector 210 of the electronic device 200 without regard to the directionality of the cable due to the symmetric structure. As an example, the USB cable may be connected to the connector 210 without matching the directionality of the pins in the connector 210.

The connector 210 having the USB type-C structure may include pins in two columns. As an example, the connector 210 may include pins A1 to A12 in a first column and pins B1 to B12 in a second column. As an example, the connector 210 may support data communication with a variety of speeds. As an example, the connector 210 may include the pins A2, A3, A10, A11, B2, B3, B10, and B11 supporting high speed data communication according to a first standard (e.g., USB 3.1), and the pins A6, A7, B6, and B7 supporting low speed data communication according to a second standard (e.g., USB 2.0). In addition, the pins A1 to A12 in the first column and the pins B1 to B12 in the second column may each perform exclusive functions of their own. For example, VBUS pins A4, A9, B4, and B9 correspond to power supply pins, GND pins A1, A12, B1, and B12 correspond to pins transferring a ground voltage, and sideband use (SBU) pins A8 and B8 are pins used to support an alternate (ALT) mode and may be connected to a cable, on which Thunderbolt, DisplayPort, high definition multimedia interface (HDMI), etc. is loaded.

In addition, the electronic device 200 adopting the connector 210 of the USB type-C structure may perform bi-directional communication. As an example, the electronic device 200 may operate as a host (e.g., downstream facing port (DFP)) or as a slave (e.g., upstream facing port (UFP)) when being connected to an external device via the USB interface. Alternatively, the electronic device 200 may operate as a dual role port (DRP), and then, the electronic device 200 may adaptively switch to a role of the host (DFP) or a device (UFP).

When the foreign substance is introduced in the connector 210, at least two pins in the connector 210 may be shorted from each other. As an example, a plurality of VBUS pins are arranged in the connector 210 of the USB type-C structure, and the VBUS pins and other pins adjacent to the VBUS pins are likely to be shorted from each other due to the foreign substance introduced in the connector 210. Accordingly, there is a possibility of the electric current flowing to the pin shorted from the VBUS pins, and accordingly, the pin may break. In particular, since there is a large demand for efficiency in charging, a power voltage from the VBUS pin is boosted in the electronic device 200 from a voltage level of minimum 5V to a voltage level of maximum 20V. Therefore, when the short occurs due to the foreign substance, there may be a high risk of breaking other pins.

According to an example embodiment, introduction of the foreign substance may be determined by using only one pin or one kind of pins in the USB type-C receptacle structure. Also, determination of the foreign substance may be performed by measuring a resistance (or impedance) that varies due to the introduction of the foreign substance. Also, according to an example embodiment, the resistance of the foreign substance may be measured by using a CC pin of the connector 210. As an example, when an external cable is connected to the connector 210 in a first direction (or normal direction), a CC1 pin is used to detect the foreign substance, and when the external cable is connected to the connector 210 in a second direction (or opposite direction), a CC2 pin may be used to detect the foreign substance.

According to an example embodiment, the CCIC 220 may communicate with an external device via the CC pins. According to an example embodiment, the CCIC 220 may perform the foreign substance detecting operation by using the CC1 pin or the CC2 pin before performing the communication operation, and may selectively perform the communication operation according to a result of detecting the foreign substance. Also, the CCIC 220 may provide the detection result Det of the foreign substance to the AP 230. In addition, the AP 230 may control various post-processes, e.g., outputting of a pop-up screen, based on the detection result Det of the foreign substance.

According to an example embodiment, since the foreign substance may be detected only by using one pin or one kind of pin in the USB type-C receptacle, limitations in configuring hardware may be reduced. Also, according to an example embodiment, since the foreign substance is detected only by using the CC pin that is included in the USB type-C receptacle, the method may have a wide range of applications. Also, according to the example embodiment, when the cable is connected to the connector 210 in a state where the electronic device 200 is in the turn-off state, circuit structures for detecting the foreign substance may be activated by the internal power or the power voltage provided through the cable, and then, the electronic device may detect the introduction of the foreign substance.

Figure 4:
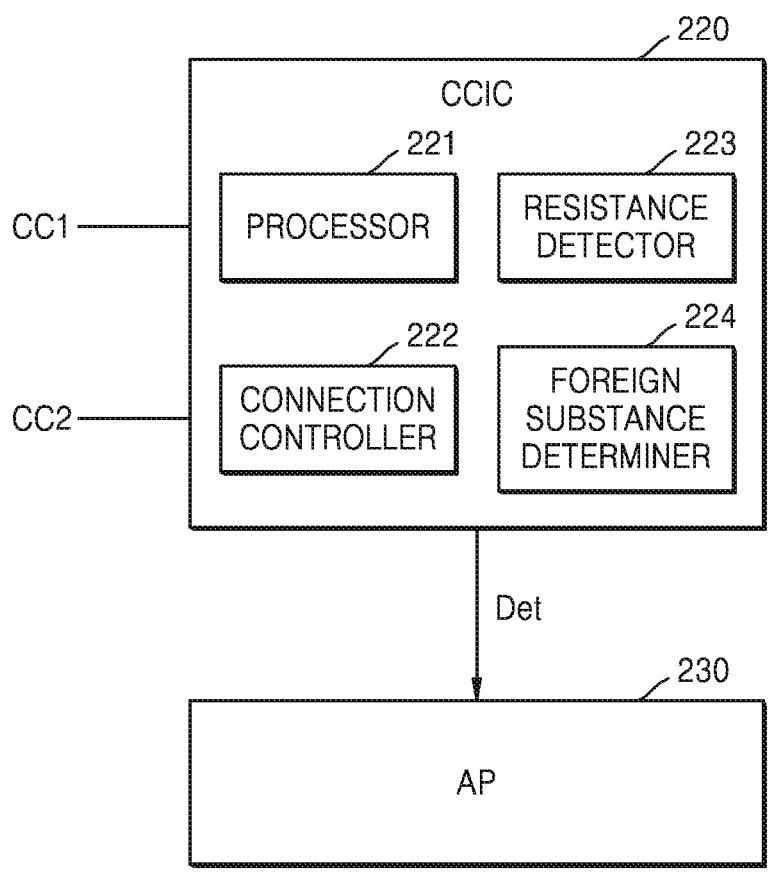
FIG. 4 is a block diagram of a configuration channel integrated circuit (CCIC) of FIG. 3.

FIG. 4 is a block diagram of the CCIC 220 of FIG. 3.

Referring to FIGS. 3 and 4, in the above system including the USB type-C connector, the CCIC 220 may support various functions and communications through the CC1 pin and the CC2 pin. As an example, the CCIC 220 may include a processor 221, a connection controller 222, a resistance detector 223, and a foreign substance determiner 224.

The processor 221 may control overall operations in the CCIC 220, as an example, the CCIC 220 may perform data connection and control operations in a normal mode and may perform various control operations for detecting the foreign substance introduced in the cable in a foreign substance detection mode.

The connection controller 222 may control an electric connection state of the CC1 pin or the CC2 pin according to the above example embodiments. As an example, the connection controller 222 may include one or more resistors and one or more switches for adjusting the connection state of the CC1 pin or the CC2 pin. According to an example embodiment, the connection controller 222 may control an electric connection state of the CC pin that is open or connected to the pull-down resistor in a state where the cable is connected to the connector. For example, in order to detect or determine whether the foreign substance is introduced, the connection controller 222 may control the connection state of one CC pin (e.g., CC1 pin) so that a discharging operation is performed with respect to the CC1 pin and then a voltage level may be detected from the CC1 pin in a state where the CC1 pin is open after finishing the discharging operation.

The voltage detected from the CC pin is provided to the resistance detector 223, and the resistance detector 223 may output a result of detecting the resistance based on the voltage level. As an example, the resistance detector 223 may compare the voltage detected from the CC pin with a desired (or, alternatively, a predetermined) reference voltage, and provide a comparison result as the result of detecting the resistance. That is, the resistance detector 223 may output the comparison result indicating whether the resistance value of the CC pin is a desired (or, alternatively, a predetermined) reference resistance value or less, or a desired (or, alternatively, a predetermined) reference resistance value or greater.

The foreign substance determiner 224 receives the result of detecting the resistance from the resistance detector 223, determines whether the foreign substance is introduced in the connector according to the detected resistance, and provides the determination result Det to the AP 230. The AP 230 may perform various functions for reducing (or, alternatively, preventing) damage and corrosion caused by the foreign substance based on the determination result Det, according to the above-described embodiments.

According to an apparatus and method of the above example embodiment, the resistance of the CC pin in the USB type-C receptacle may be measured to determine whether there is the foreign substance, and then, boosting of the VBUS voltage may be restricted or the voltage and/or current provided to the connector may be reduced or blocked according to the result of determining the foreign substance. In addition, a warning message is provided to a user to reduce (or, alternatively, prevent) damage to a device.

Also, only the CC pin from among the pins of the USB type-C receptacle may be used as an input for measuring the resistance, and there is no need to configure additional hardware. Thus, the method according to example embodiments may be widely applied. Also, in a state where the cable is connected to the connector, the pin having an open state from among a plurality of pins is used to detect the foreign substance. Thus, the cable has been already coupled to the connector, and the foreign substance may be detected.

In addition, in the example embodiment illustrated in FIG. 4, the resistance detector 223 and the foreign substance determiner 224 are described as separate elements, but the example embodiments of the inventive concepts are not limited thereto. As a modified example, a result of detecting the resistance provided from the resistance detector 223 may be used as a result of determining the foreign substance. For example, in some example embodiments, the connection controller 222, the resistance detector 223 and the foreign substance determiner 224 be provided in one or more integrated circuits (ICs) and/or the processor 221 may execute instructions to perform the features of one or more of the same.

Figure 5:
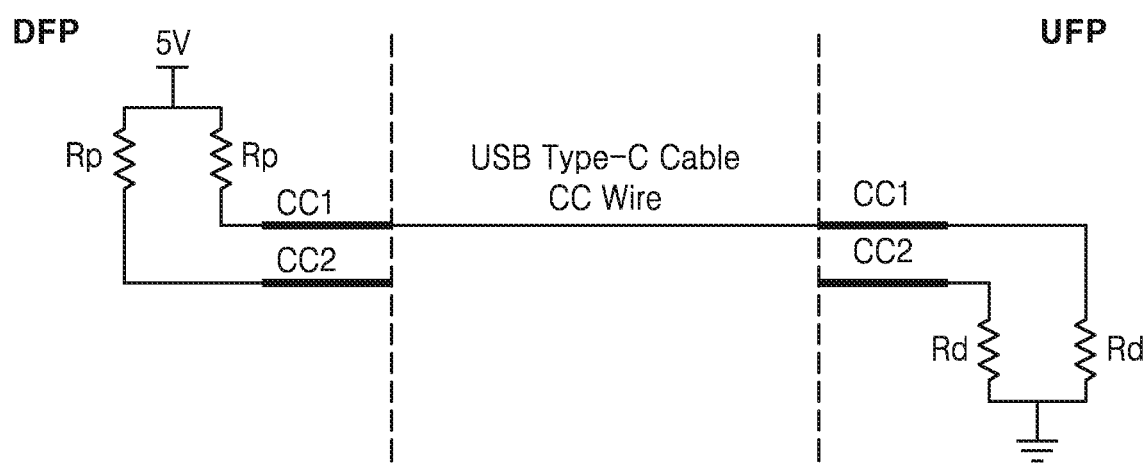
FIG. 5 is a circuit diagram showing a status of a configuration channel (CC) pin when a cable is connected to a USB type-C connector.
Figure 6A:
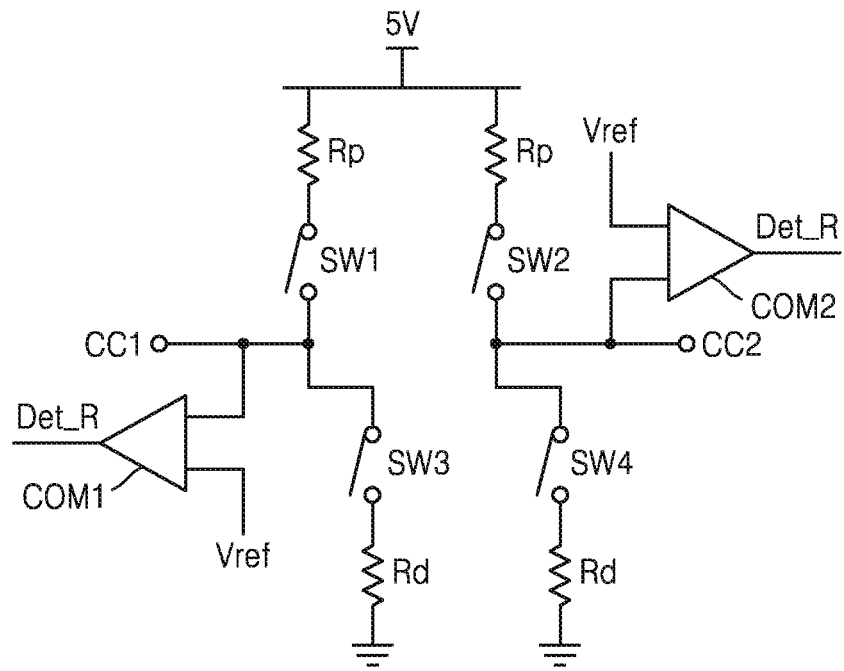
FIGS. 6A and 6B are circuit diagrams showing an example of a circuit state when a short-circuit occurs due to a connecting states of CC pins and foreign substances.
Figure 6B:
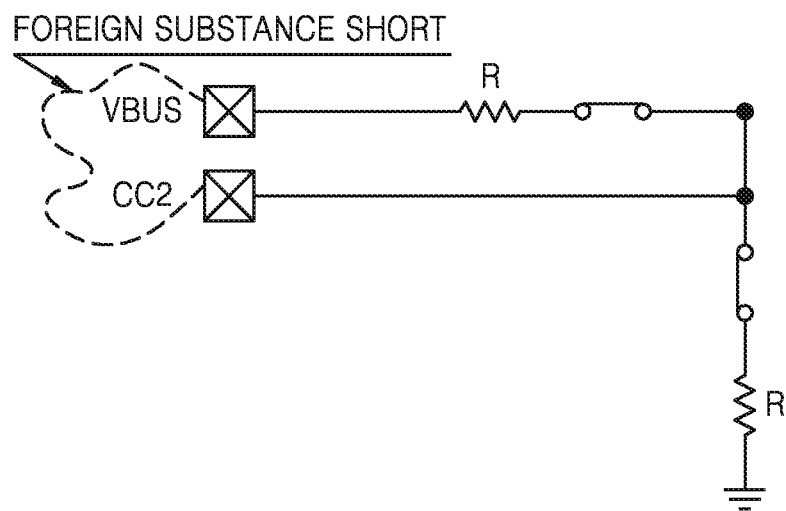

FIG. 5 is a circuit diagram of a CC pin when a cable is connected to a USB type-C connector, and FIGS. 6A and 6B are circuit diagrams showing examples of a circuit when a short-circuit occurs due to a connecting state of the CC pins and due to the foreign substance. The foreign substance may include various materials generating resistance, and hereinafter, it will be assumed that the foreign substance is moisture.

As described above, a system adopting a connector having a USB type-C structure may perform bi-directional communication. As an example, the system adopting the connector of the USB type-C structure may operate as a host (e.g., DFP) or a slave (e.g., UFP) when being connected to an external device via a USB interface. FIG. 5 shows an example in which the electronic device according to the example embodiment operates as a slave (UFP), and when the cable is connected to the connector of the electronic device, one of the CC1 pin and the CC2 pin is connected to a desired (or, alternatively, a predetermined) power voltage and the other has an open state. In addition, connecting states of the CC1 pin and the CC2 pin may be different from each other according to whether the electronic device operates as the host (DFP) or the slave (UFP).

Referring to FIG. 5, when the cable is connected, the CC1 pin and the CC2 pin may have desired (or, alternatively, predetermined) connection states. For example, the CC1 pin and the CC2 pin may be connected to desired (or, alternatively, predetermined) resistors Rp and Rd defined in the USB type-C, and when the cable is connected to the connector, the CC1 pin may be connected to a desired (or, alternatively, predetermined) power voltage (e.g., a power voltage of 5V) and the CC2 pin may have an open state. When the cable is connected in an opposite direction, the CC1 pin may have an open state and the CC2 pin may be connected to the power voltage.

According to an example embodiment, detection of moisture may be performed by using the CC2 pin that is set to be open when the cable is connected to the connector. As an example, in the connection states of the CC1 pin and the CC2 pin as shown in FIG. 5, a discharging operation is performed with respect the CC2 pin having the open state, and after finishing the discharging operation, a resistance may be detected from the CC2 pin in order to determine whether there is moisture.

Referring to FIG. 6A, the system adopting the connector of the USB type-C structure may include a resistor and a switch that are respectively connected to the CC1 pin and the CC2 pin. As an example, resistors Rp and Rd and switches SW1 and SW3 may be arranged to correspond to the CC1 pin, and the resistors Rp and Rd and switches SW2 and SW4 may be arranged to correspond to the CC2 pin. Also, a comparator COM1 for detecting a voltage from the CC1 pin and a comparator COM2 for detecting a voltage from the CC2 pin may be further provided, and each of the comparators COM1 and COM2 may receive a reference voltage Vref and output a result of detecting voltage or resistance Det_R.

The system may communicate with an external device by controlling the switches SW1 to SW4, and as an example, one of the CC1 pin and the CC2 pin may be connected to the resistor Rp or the resistor Rd according to a connecting state to the external device. Also, the other one of the CC1 pin and the CC2 pin may be set as an open (or floating) state.

Referring to FIGS. 5 and 6A, the switches SW1 to SW4 may be controlled to perform a moisture detecting operation before communicating with the external device, according to an example embodiment of the inventive concept. For example, when the CC2 pin has an open state according to the connecting state, the CC2 pin may be discharged by controlling the switches SW2 and SW4 corresponding to the CC2 pin. Also, after finishing the discharging operation, the CC2 pin may be set as a floating state by controlling the switches SW2 and SW4, and the comparator COM2 may output a result of comparing a voltage level of the CC2 pin with a level of the reference voltage Vref.

When the moisture is introduced in the connector, a voltage having high level may be detected from the CC2 pin as the moisture has low resistance. For example, when it is determined that the voltage from the CC2 pin is greater than the level of the reference voltage Vref, the system may determine that the moisture is introduced in the connector. The resistance caused by the foreign substance may be detected throughout a variety of range, according to a resistance value of the CC2 pin in the open state, and theoretically, a resistance of maximum 20 ME may be detected.

When the moisture is introduced, a short-circuit may occur between the CC2 pin and a pin transferring the power voltage (e.g., VBUS pin), and a level of the voltage detected from the CC2 pin varies depending on the power voltage of the VBUS pin. In a normal state, that is, the moisture is not introduced, the CC2 maintains at the ground voltage GND state. However, when the moisture has been introduced in the connector, a voltage of the VBUS pin may flow in the CC2 pin via the moisture, and accordingly, the voltage level detected from the CC2 pin may vary. For example, as shown in FIG. 6B, a undesired (or, alternatively, a predetermined) resistance R is generated between the VBUS pin and the CC2 pin due to the introduction of the moisture, and the voltage level detected from the CC2 pin based on the resistance R value may vary.

In addition, in the example embodiment illustrated in FIGS. 6A and 6B, in a case where a short-circuit occurs between the VBUS pin and the CC2 pin, it will be assumed that the short-circuit has occurred between the CC2 pin and the VBUS pin due to the moisture having a resistance of 1 MS as follows.

In a normal state where the moisture is not introduced, when the CC2 pin is discharged and open and then a voltage value is measured from the CC2 pin, a ground voltage GND may be measured. However, in a state where the moisture is introduced in the connector, the power voltage (e.g., VBUS voltage) may be supplied to the CC2 pin via the moisture having the resistance of 1 MΩ, and a voltage of 2V or greater may be detected from the CC2 pin when the VBUS voltage is 5V. That is, the foreign substance may be detected even in a case where the cable is in connection with the connector, by using the above situation.

As described above, the CC2 pin that is not connected is open for detecting the moisture, and it may be assumed that the resistance in the open state is 1 MS to 9 MΩ. Here, as the resistance in the open state increases, a detectable range of the resistance of the moisture also increases. Assuming that the resistance in the open state is 1 MS that is a minimum value in the above range and the VBUS voltage is 5V, the voltage detected from the CC2 pin may correspond to 5V×1 MΩ/(moisture resistance+1 MΩ). In the above formula, when the detected voltage is 200 mV or greater, the moisture may be detected.

Figure 7:
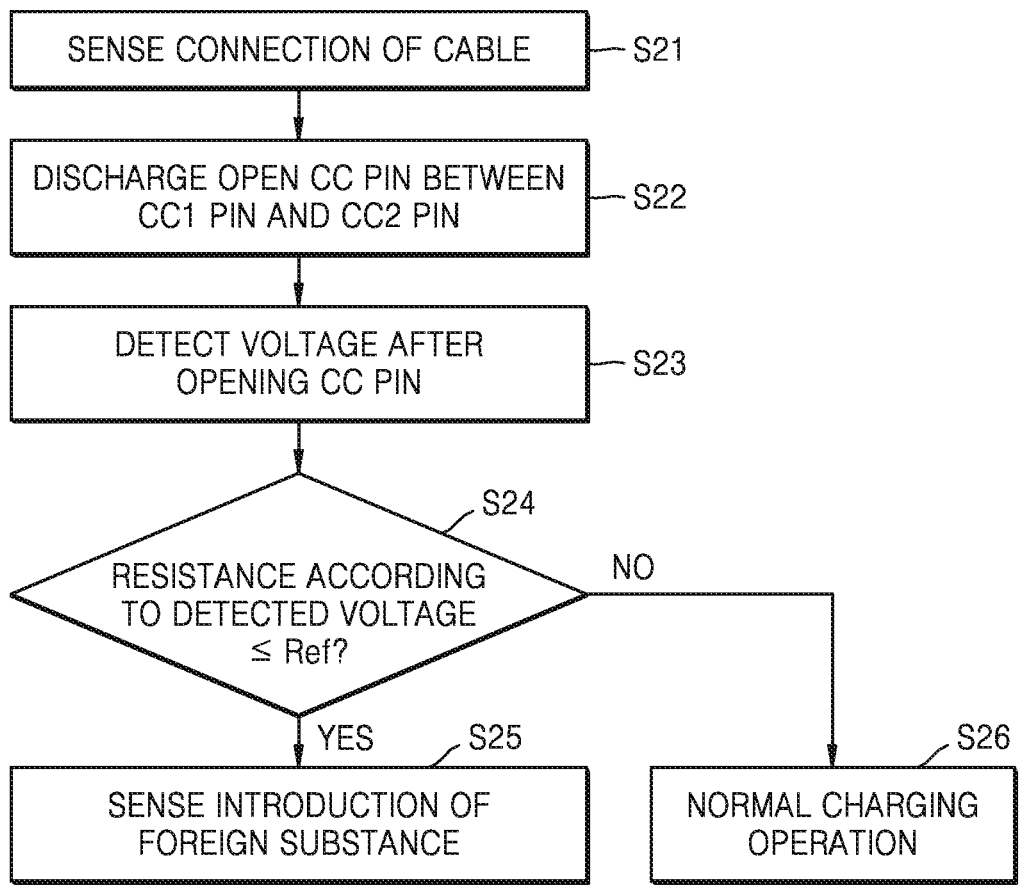
FIG. 7 is a flowchart illustrating a method of detecting a foreign substance, according to an example embodiment of the inventive concepts.

FIG. 7 is a flowchart illustrating a method of detecting a foreign substance, according to an example embodiment.

Referring to FIG. 7, in operation S21, a connected state may be identified when a cable is connected to a connector of an electronic device. In addition, according to a USB type specification, one of the CC1 pin and the CC2 pin may be in a connected state, and the other may have an open state, and a foreign substance may be detected by using the CC pin having the open state.

In operation S22, the electronic device may perform a discharging operation of the CC pin in the open state.

After finishing the discharging operation, in operation S23, the electronic device may open the CC pin and a voltage of the CC pin may be detected.

In operation S24, the electronic device may determine a resistance value based on the detected voltage.

In operation S25, the electronic device may determine that the resistance is caused by the foreign substance when the resistance is less than a desired (or, alternatively, a predetermined) reference value, and accordingly, it may be identified that the foreign substance is introduced in the connector.

In contrast, in operation S26, the electronic device may determine that the cable is normally connected without introduction of the foreign substance when the resistance is greater than the desired (or, alternatively, the predetermined) reference value, and accordingly, a normal charging operation may be performed.

According to an example embodiment, the resistance may be determined in a plurality of steps according to resistance value thereof, and a kind of the foreign substance, e.g., moisture, may be determined based on the step of the detected resistance.

Figure 8:
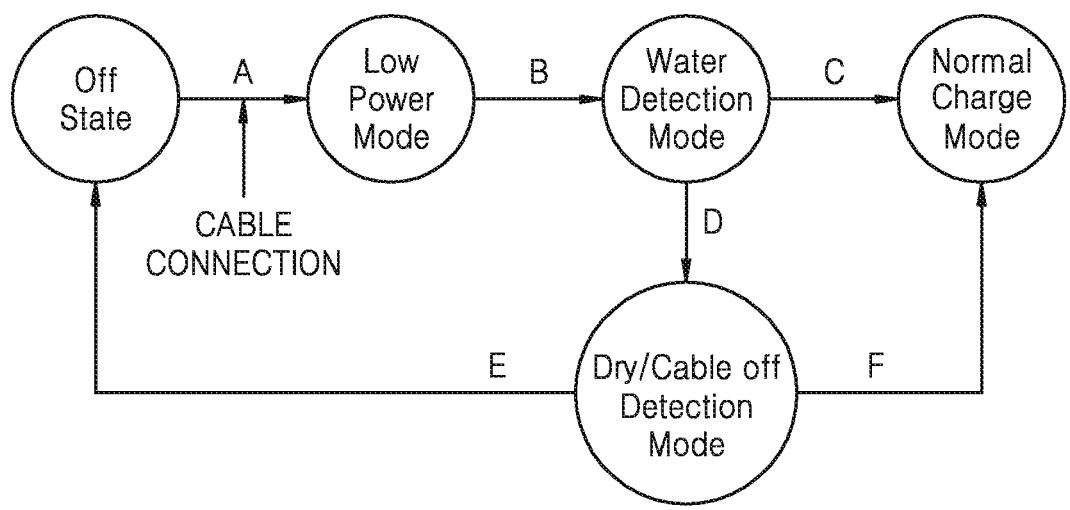
FIG. 8 is a diagram showing operation modes of an electronic device according to an example embodiment of the inventive concepts.

FIG. 8 is a diagram showing operation modes of an electronic device according to example embodiments.

Referring to FIG. 8, when the electronic device is turned off, a turn-off state of the electronic device may be maintained. When an external cable is connected to a connector of the electronic device, the electronic device may be switched to a low-power mode from the turn-off state (A), and in the low-power mode, the electronic device may enter a foreign substance (e.g., moisture) detection mode (B).

In the moisture detection mode, the moisture detection operation may be performed by using at least one pin of the connector according to the above example embodiments. As an example, a voltage may be detected from a pin having an open state (e.g., CC pin) in a state where the cable is connected to the connector, and when it is determined that the cable is normally connected without introduction of the moisture based on a result of detecting the voltage, the electronic device may switch to a normal charging mode from the moisture detection mode (C). On the other hand, when it is determined that the moisture is introduced in the connector, a post-process such as displaying of a pop-up notification to a user or controlling of internal power may be performed according to the above embodiments.

According to an example embodiment, in a state that the cable is continuously connected to the connector, the electronic device may be switched to a dry/cable removal detection mode from the moisture detection mode (D). In the dry/cable removal detection mode, when the voltage is periodically or continuously detected from the CC pin and the detection result indicates that the moisture is dried, the electronic device may be switched from the dry/cable removal detection mode to the normal charging mode (F). On the other hand, when the moisture is not dried for a desired (or, alternatively, a predetermined) time period or it is detected that the cable is removed, the electronic device may be switched to a turn-off state (E).

According to the example embodiment illustrated in FIG. 8, in a case where component of the foreign substance is reduced according to time, e.g., moisture, the electronic device may automatically enter the normal charging mode based on a dry detection operation. For example, while the current flowing to the connector is blocked or a boosting operation is prevented as the moisture is detected in the moisture detection mode, when it is identified that the moisture is dried, the electronic device may enter the normal charging mode to normally perform an operation for charging and an operation for communication. As an example, according to the above example embodiment, drying of the moisture may be identified through a comparison between the voltage detected from the CC pin with a desired (or, alternatively, a predetermined) reference voltage.

Figure 9:
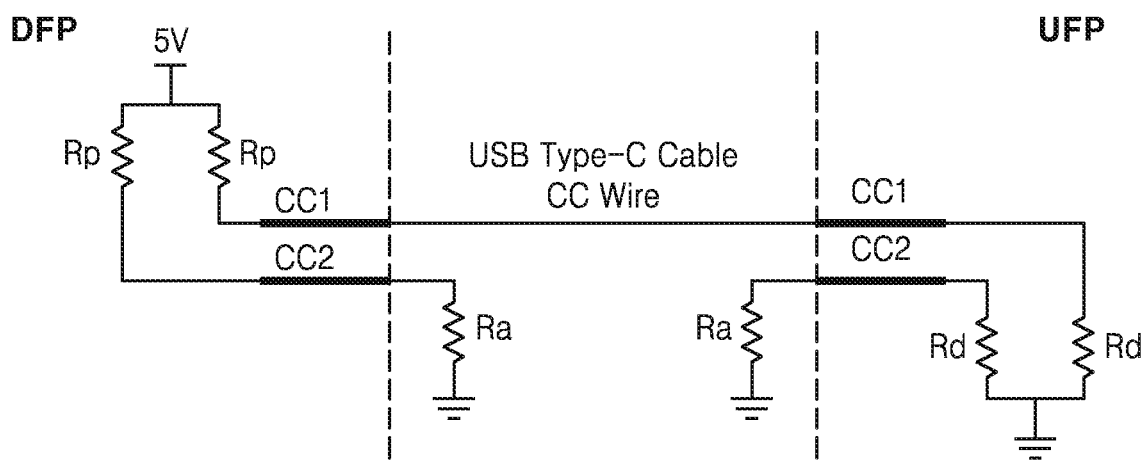
FIG. 9 is a circuit diagram showing a connecting state of an electronic device according to a modified example embodiment of the inventive concepts.

FIG. 9 is a circuit diagram showing a connecting status of an electronic device according to a modified example embodiment of the inventive concepts.

FIG. 9 illustrates an example, in which one of the CC1 pin and the CC2 pin is connected to a desired (or, alternatively, a predetermined) power voltage and the other is connected to a desired (or, alternatively, a predetermined) pull-down voltage when a cable is connected to a connector. For example, an example in which the CC1 pin is connected to a power voltage corresponding to 5V and the CC2 pin is connected to a pull-down resistor Ra defined according to the USB type-C is shown. Although not shown in FIG. 9, the electronic device may further include one or more resistors and a plurality of switches for controlling the connecting states of the CC1 pin and the CC2 pin.

Referring to FIG. 9, when an external cable is connected to the connector, a CCIC (not shown) performs a control operation on switches connected to the CC1 pin and the CC2 pin2, performs a discharging of the CC2 pin, opens the CC2 pin after finishing the discharging operation, and determines whether the foreign substance is introduced based on a result of detecting the voltage level from the CC2 pin. For example, the CC2 pin is connected to a ground voltage via the pull-down resistor Ra, and when the foreign substance is not introduced, a ground voltage level may be detected from the CC2 that has been discharged.

However, when the foreign substance is introduced, a short-circuit may occur between a pin transferring the power voltage, e.g., a VBUS pin, and the CC2 pin, and as such, a level of the voltage detected from the CC2 pin may vary. That is, in a case where the CC2 pin is connected to the pull-down resistor when the cable is connected, it may be determined whether the foreign substance is introduced in the connector according to the above example embodiment of the inventive concepts. The voltage level (or resistance value) detected due to a same kind of foreign substance may vary according to whether the CC2 pin is in the open state or is connected to the pull-down resistor, and accordingly, the electronic device may be set so that the reference value (e.g., reference voltage) used to determine the introduction of the foreign substance may be changed according to whether the CC2 pin is in the open state or is connected to the pull-down resistor.

Figure 10:
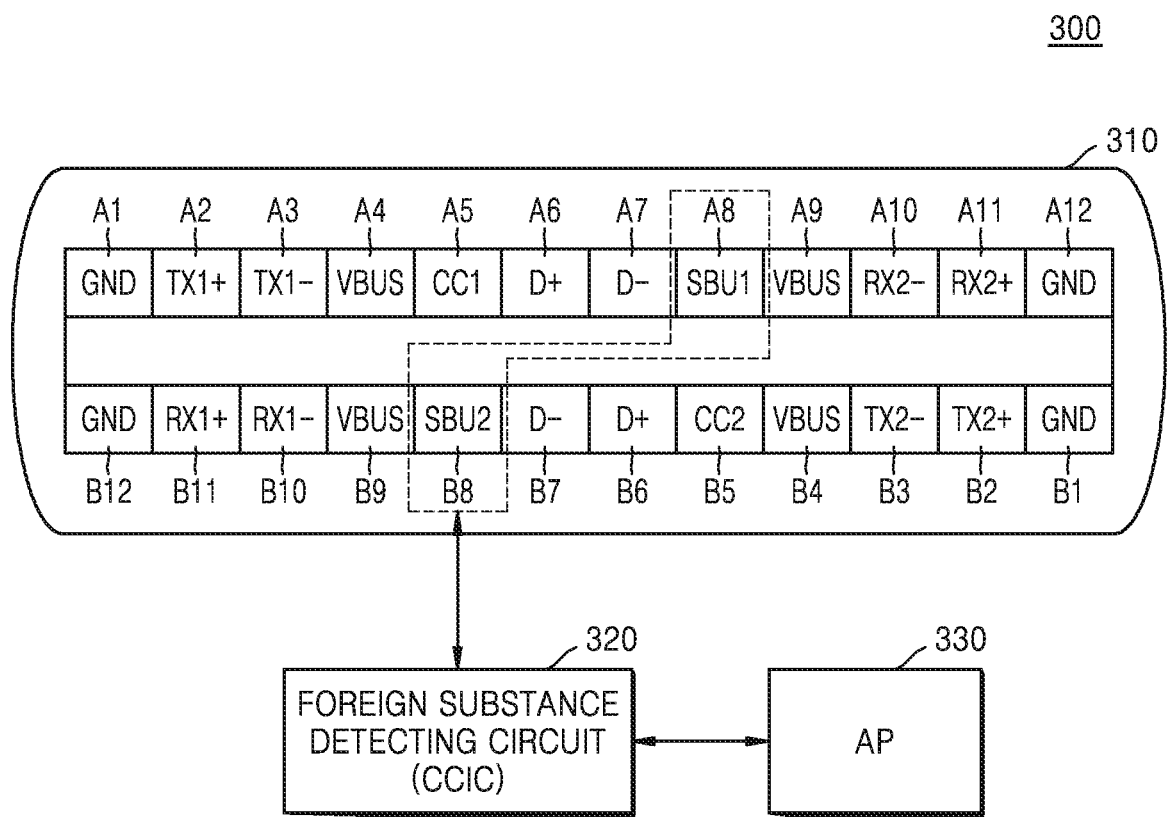
FIGS. 10 and 11 are diagrams showing an example of detecting foreign substances by using various kinds of pins according to an example embodiment of the inventive concepts.
Figure 11:
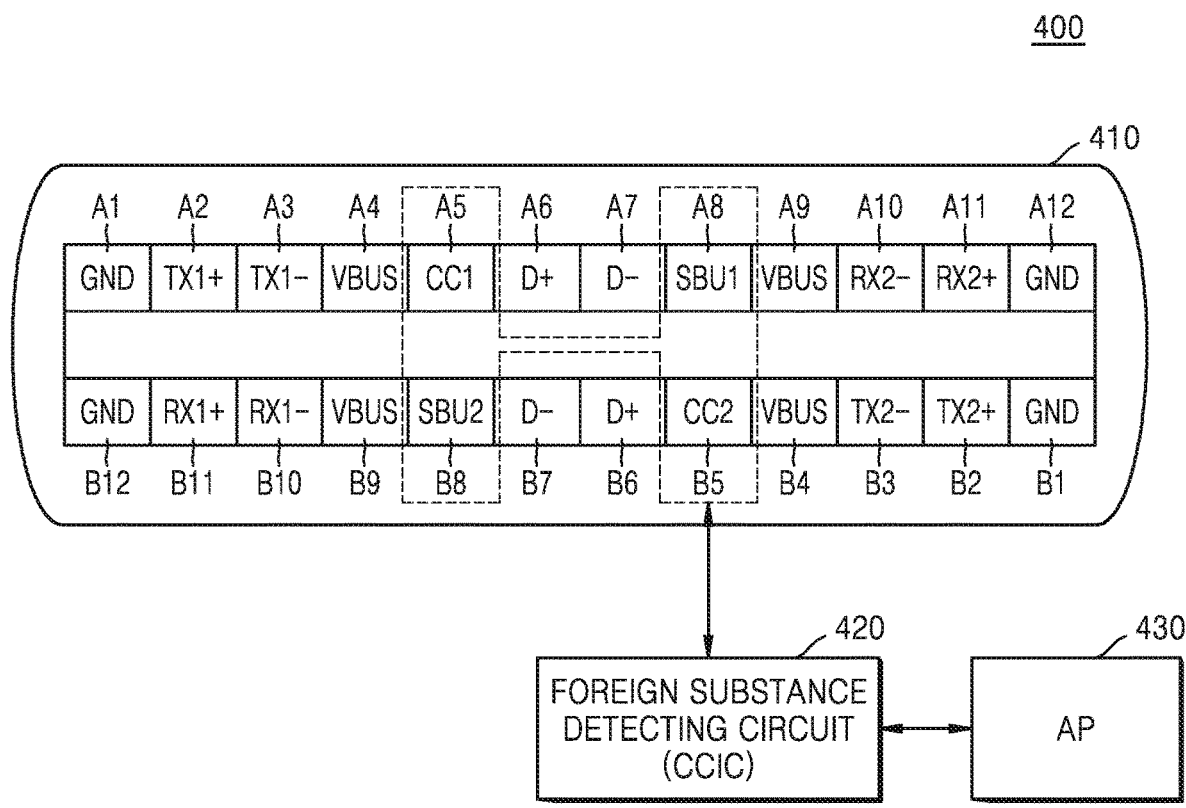

FIGS. 10 and 11 are diagrams showing an example of detecting foreign substances by using various kinds of pins according to an example embodiment.

Referring to FIG. 10, an electronic device 300 may include a connector 310 of a USB type-C structure, a foreign substance detecting circuit 320, and an AP 330. The connector 310 may include various kinds of pins, for example, the connector 310 may further include a sideband use (SBU)1 pin A8 and an SBU2 pin B8, in addition to the CC1 pin and the CC2 pin described with reference to the above embodiment. Also, as shown in FIG. 10, the connector 310 of the USB type-C structure may include four VBUS pins A4, A9, B4, and B9, and the CC1/CC2 pins A5 and B5 and the SBU1/SBU2 pins A8 and B8 may be arranged adjacent to the VBUS pins A4, A9, B4, and B9.

When the cable is connected to the connector 310, at least one of the SBU1 pin A8 and the SBU2 pin B8 may perform a function for supporting an ALT mode in a normal mode according to a kind of the cable. Also, according to the kind of the cable, one of the SBU1 pin A8 and the SBU2 pin B8 may have an open state or both the SBU1 and SBU2 pins A8 and B8 may have the open states. Also, the foreign substance detecting circuit 320 may be provided in the CCIC according to the above embodiment, and the CCIC may support a function using at least one of the SBU1 pin A8 and the SBU2 pin B8 in the normal mode.

According to the connecting state between the connector 310 and the cable, the CCIC may determine which one of the SBU1 pin A8 and the SBU2 pin B8 has an open state (or is connected to the pull-down resistor). According to the example embodiment, the foreign substance detecting circuit 320 may detect a voltage one of the SBU1 pin A8 and the SBU2 pin B8, which has an open state or is connected to the pull-down resistor, and based on that, the foreign substance detecting circuit 320 may determine whether the foreign substance is introduced. Identically with or similarly to the above-described example embodiment, a discharging operation may be performed on the SBU pin having the open state, and after finishing the discharging operation, the voltage is detected from the SBU pin, and then, introduction of the foreign substance may be determined based on a detected voltage level. When the foreign substance is introduced in the connector, a pin transferring a desired (or, alternatively, a predetermined) power voltage and the SBU pin are shorted from each other, and accordingly, a level of the voltage detected from the SBU pin increases, and when the detected voltage level exceeds a desired (or, alternatively, a predetermined) reference value, it may be determined that the foreign substance is introduced.

In addition, when the SBU1/SBU2 pins A8 and B8 perform a desired (or, alternatively, a predetermined) function without being open according to the connecting state between the connector 310 and the cable, the CCIC may determine the connecting states of the SBU1 and SBU2 pins A8 and B8, and the foreign substance detecting circuit 320 may not perform the foreign substance detection operation according to the above example embodiment.

In addition, referring to FIG. 11, an electronic device 400 may include a connector 410 of a USB type-C structure, a foreign substance detecting circuit 420, and an AP 430, and as described above, the connector 410 may include various kinds of pins, and when an external cable is connected to the connector 410, at least one pin of the connector 410 may have an open state or is connected to a pull-down resistor. In the example embodiment illustrated in FIG. 11, it is assumed that when the external cable is connected to the connector 410, one CC pin (for example, CC2 pin) and one SBU pin (for example, SBU2 pin) have the open state or are connected to the pull-down resistor.

The foreign substance detecting circuit 420 may be included in the CCIC, and the CCIC may perform a communication operation by using the CC1 pin, the CC2 pin, the SBU1 pin, and the SBU2 pin. Also, the foreign substance detecting circuit 420 may detect a voltage level from each of the CC2 pin and the SBU2 pin and may determine whether the foreign substance is introduced according to the detected voltage level, before performing the communication operation.

In the example embodiment illustrated in FIG. 11, the foreign substance detecting circuit 420 determines whether the foreign substance is introduced by using the voltage levels detected from two or more pins. When the foreign substance such as the moisture is introduced in the connector 410, a plurality of pins are likely to be shorted from one another, and accordingly, an accuracy of identifying the foreign substance may be improved when the voltage levels detected from two or more pins are used. For example, the foreign substance detecting circuit 420 performs the discharging operation of the CC2 pin and the SBU2 pin and detects a voltage from each pin after finishing the discharging operation, and then, may finally determine whether there is the foreign substance by combining results of detecting voltages from the CC2 pin and the SBU2 pin. As an example, it may be finally determined that there is the foreign substance when the foreign substance is detected from one of the CC2 pin and the SBU2 pin, or when the foreign substance is detected from both the CC2 pin and the SBU2 pin.

Figure 12:
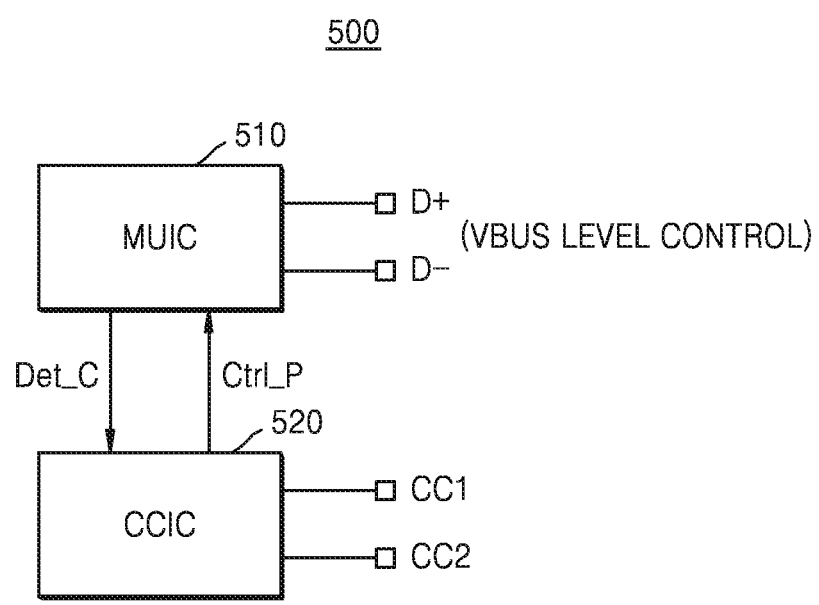
FIG. 12 is a block diagram of an electronic device according to an example embodiment of the inventive concepts.

FIG. 12 is a block diagram of an electronic device 500 according to an example embodiment.

Referring to FIG. 12, the electronic device 500 may include a micro USB IC (MUIC) 510 and a CCIC 520, and each of the MUIC 510 and the CCIC 520 may be connected to at least one pin of a connector (not shown) to perform an exclusive function of its own. For example, the MUIC 510 may be connected to D+ pins A6 and B6 and D− pins A7 and B7 in the above USB type-C structure, and the MUIC 510 may identify that an external device is connected thereto via sensing a cable and may communicate with an external device via the D+ pins A6 and B6 and the D− pins A7 and B7. In addition, the CCIC 520 may perform control operations for setting the DFP, UFP, and DRP as described above.

According to an example embodiment, the MUIC 510 may provide a signal (Det_C) of sensing connection of the external device to the CCIC 520, and the CCIC 520 may perform the foreign substance detecting operation in response to the reception of the sensing signal Det_C according to the above example embodiments. For example, the CCIC 520 may determine whether there is the foreign substance based on the discharging operation and resistance detection of the CC1 pin or the CC2 pin, and when there is the foreign substance, the CCIC 520 may control a corresponding post-process. Also, the CCIC 520 may provide a control signal Ctrl_P for reducing a level of power or turning off the power provided from the external device to the connector, to the MUIC 510 when there is the foreign substance in the connector.

The MUIC 510 may communicate with an external device via at least one of the D+ pins A6 and B6 and the D− pins A7 and B7, and may provide the external device with a request for reducing the power voltage level or blocking the supply of the power voltage based on the control signal Ctrl_P from the CCIC 520. Accordingly, when the foreign substance is introduced to the connector of the electronic device, corrosion and damage of the pins due to the foreign substance may be inhibited (or, alternatively, prevented).

In addition, the example embodiments of the inventive concepts may be applied to various product groups, for example, the product groups using USB PD type-C, e.g., a personal computer (PC), a laptop, a smart phone, a monitor, a travel adaptor (TA), a dongle, etc. using the USB type-C.

The units and/or devices described above, such as the components of the electronic device (e.g., 100, 200, 300, 400) including the foreign substance detecting circuit, power controller, display control circuit, application processor and configuration channel IC (CCIC) (e.g., 220) as well as the sub-components thereof (e.g., the processor, resistance detector, connection controller, and foreign substance determiner) may be implemented using hardware, a combination of hardware and software, or a non-transitory storage medium storing software that is executable to perform the functions of the same.

Hardware may be implemented with various hardware devices, such as integrated circuits (ICs), application specific ICs (ASICs), field programmable gate array (FPGAs), complex programmable logic device (CPLDs), system on chips (SoCs) or processing circuity such as one or more Central Processing Units (CPUs), one or more controllers, one or more arithmetic logic units (ALUs), one or more digital signal processors (DSPs), one or more microcomputers, or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be illustrated as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein.

The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While the inventive concepts has been particularly shown and described with reference to some example embodiments thereof, it will be understood that various changes in form and details may be made therein without departing from the spirit and scope of the following claims.

What is claimed is:

1. An electronic device comprising:
a connector configured to connect to an external cable and communicate with the external cable according to a universal serial bus (USB) type-C interface, the connector including a plurality of pins;
a foreign substance detecting circuit configured to,
detect a resistance from a first pin from among the plurality of pins, in response to the external cable being connected to the connector, the first pin being one of a configuration channel 1 (CC1) pin and a configuration channel 2 (CC2) pin defined by the USB type-C interface, the first pin being set to an open state or connected to a pull-down resistor, and
determine whether there is a foreign substance present in the connector based on the resistance; and
an application processor configured to perform a post-process in response to the foreign substance detecting circuit determining that the foreign substance is present in the connector.

2. The electronic device of claim 1, wherein the post-process includes instructing a display device to display an indication that the foreign substance is present in the connector.

3. The electronic device of claim 1, further comprising:
a power controller configured to adjust a level of a voltage or a current provided to the connector, wherein
the post-process includes instructing the power controller to block supply of the voltage or the current to the connector.

4. The electronic device of claim 1, wherein the foreign substance detecting circuit is configured to determine whether the foreign substance is present when the external cable is connected to the connector in a state where the electronic device is in a turn-off state.

5. The electronic device of claim 1, wherein the foreign substance detecting circuit is a configuration channel integrated circuit (CCIC) configured to perform a data connection and control operation via at least one of the CC1 pin and the CC2 pin in a normal mode.

6. The electronic device of claim 1, wherein the connector further comprises a VBUS pin defined by the USB type-C interface to transfer a power voltage, and the electronic device is configured such that,
when there is foreign substance, the VBUS pin and the first pin are shorted, and the voltage exceeding a reference level is measurable from the first pin, and
when there is no the foreign substance, the VBUS pin and the first pin are not shorted from each other, and the voltage less than the reference level is measurable from the first pin.

7. The electronic device of claim 1, further comprising:
a micro USB IC (MUIC) configured to sense a connection between the external cable and the connector, and to perform communication with an external device via at least one second pin of the connector, wherein
the foreign substance detecting circuit is configured to initiate detection of the resistance in response to the MUIC sensing the connection, and
the MUIC is configured to communicate with the external device to reduce a level of a power voltage provided from the external device in response to the foreign substance being present in the connection.

8. The electronic device of claim 1, wherein the foreign substance detecting circuit is configured to detect moisture as the foreign substance introduced in the connector.

9. A configuration channel integrated circuit (CCIC) connected to a configuration channel 1 (CC1) pin and a configuration channel 2 (CC2) pin of a connector according to a universal serial bus (USB) type-C interface, the CCIC comprising:
a processor configured to control internal operations in the CCIC; and
at least one controller configured to,
control, in a normal mode, connection to the CC1 pin and the CC2 pin to perform a data connection and control operation,
control, in a foreign substance detection mode, connection to a first pin in response to an external cable being connected to the connector, the first pin being one of the CC1 pin and the CC2 pin that is set to an open state,
set the first pin to a floating state after discharging the first pin in the foreign substance detection mode, and
determine whether there is a foreign substance in the connector based on a resistance detected from the first pin.

10. The CCIC of claim 9, wherein
the first pin corresponds to the CC1 pin when the external cable is connected to the connector in a first orientation, and
the first pin corresponds to the CC2 pin when the external cable is connected to the connector in a second orientation opposite the first orientation.

11. The CCIC of claim 9, wherein the at least one controller is configured to determine whether the foreign substance is present in response to the external cable being connected to the connector in a state where an electronic device including the CCIC is turned-off.

12. The CCIC of claim 9, wherein the at least one controller is configured to determine whether the foreign substance is present in the connector based on the resistance detected from the first pin in the floating state after being discharged.

13. The CCIC of claim 9, wherein the at least one controller is configured to skip determining whether there the foreign substance is present, in response to the external cable being connected to the connector while the CC1 pin and the CC2 pin are both not set to the open state.

14. A method of detecting a foreign substance in an electronic device, the method comprising:
sensing an external cable being connected to a connector, the connector including a plurality of pins; and
in response to sensing that the external cable is connected to the connector,
performing a discharging operation of a first pin of the plurality of pins while the first pin is set to an open state or connected to a pull-down resistor;
setting the first pin to a floating state after the discharging operation;
detecting a resistance from the first pin based on a voltage measured from the first pin while the first pin is set to the floating state;
determining whether the foreign substance is present in the connector based on the resistance detected from the first pin when the first pin is in the floating state; and
instructing, a display device, to display an indication that the foreign substance is present in the connector in response to determining that the foreign substance is present.

15. The method of claim 14, wherein the electronic device is in a turn-off state before the external cable is connected to the connector, and the determining determines whether the foreign substance is present in response to the external cable being connected to the connector in the turn-off state.

16. The method of claim 14, wherein
the connector is configured to communicate with the external cable according to a universal serial bus (USB) type-C interface, and
the first pin corresponds to one of a configuration channel 1 (CC1) pin and a configuration channel 2 (CC2) pin defined according to the USB type-C interface.

* * * * *